United States Patent
Bühler et al.

(10) Patent No.: US 8,815,623 B2
(45) Date of Patent: Aug. 26, 2014

(54) METHOD FOR MANUFACTURING AN INTERGRATED PRESSURE SENSOR

(75) Inventors: Johannes Bühler, Uster (CH); Felix Mayer, Stäfa (CH); Matthias Streiff, Zürich (CH); René Hummel, Baar (CH); Robert Sunier, Zürich (CH)

(73) Assignee: Sensirion AG, Stafa (CH)

( * ) Notice: Subject to any disclaimer, the term of this patent is extended or adjusted under 35 U.S.C. 154(b) by 890 days.

(21) Appl. No.: 12/462,582

(22) Filed: Aug. 5, 2009

(65) Prior Publication Data

US 2010/0055821 A1   Mar. 4, 2010

(30) Foreign Application Priority Data

Aug. 28, 2008  (EP) ..................................... 08015174

(51) Int. Cl.
*H01L 21/78* (2006.01)
*H01L 21/02* (2006.01)
*B81C 1/00* (2006.01)
*G01L 9/00* (2006.01)

(52) U.S. Cl.
CPC ....... *G01L 9/0073* (2013.01); *B81B 2203/0127* (2013.01); *B81B 2203/0353* (2013.01); *B81B 2201/0264* (2013.01); *B81B 2203/0315* (2013.01); *B81C 1/00087* (2013.01); *B81C 2201/0143* (2013.01); *B81C 1/00801* (2013.01)
USPC .............. 438/51; 257/E21.002; 257/E21.599

(58) Field of Classification Search
None
See application file for complete search history.

(56) References Cited

U.S. PATENT DOCUMENTS

| | | |
|---|---|---|
| 4,625,561 A | 12/1986 | Mikkor |
| 4,730,496 A | 3/1988 | Knecht et al. |
| 4,949,581 A | 8/1990 | Rud, Jr. |
| 5,062,302 A | 11/1991 | Petersen et al. |
| 5,155,061 A | 10/1992 | O'Connor et al. |
| 5,343,064 A | 8/1994 | Spangler et al. |
| 5,576,251 A | 11/1996 | Garabedian et al. |
| 5,683,594 A | 11/1997 | Hocker et al. |

(Continued)

FOREIGN PATENT DOCUMENTS

| | | |
|---|---|---|
| DE | 10201054 | 1/2003 |
| EP | 0992778 | 4/2000 |

(Continued)

OTHER PUBLICATIONS

High Throughput Low CoO Industrial Laser Drilling Tool, A.M. Rodin et al., 4th International Conference and Exhibition on Device Packaging, Scottsdale, Arizona, Mar. 17-20, 2008.

(Continued)

*Primary Examiner* — Seahvosh Nikmanesh
(74) *Attorney, Agent, or Firm* — Cooper & Dunham LLP

(57) ABSTRACT

A differential pressure sensor comprises a membrane arranged over a cavity on a semiconductor substrate. A lid layer is arranged at the top side of the device and comprises an access opening for providing access to the top side of the membrane. A channel extends laterally from the cavity and intersects with a bore. The bore is formed by laser drilling from the bottom side of the substrate and provides access to the bottom side of the membrane. The bore extends all through the substrate and optionally into the lid layer.

21 Claims, 5 Drawing Sheets

(56) References Cited

U.S. PATENT DOCUMENTS

| | | |
|---|---|---|
| 5,929,498 A | 7/1999 | Ismail et al. |
| 5,936,164 A | 8/1999 | Sparks et al. |
| 5,939,164 A | 8/1999 | Kubo et al. |
| 5,962,081 A | 10/1999 | Ohman et al. |
| 6,085,596 A | 7/2000 | Jensen et al. |
| 6,143,583 A | 11/2000 | Hays |
| 6,229,190 B1 | 5/2001 | Bryzek et al. |
| 6,346,742 B1 | 2/2002 | Bryzek et al. |
| 6,395,585 B2 | 5/2002 | Brandl |
| 6,465,271 B1 | 10/2002 | Ko et al. |
| 6,584,854 B2 | 7/2003 | Kimura et al. |
| 6,700,174 B1 | 3/2004 | Miu et al. |
| 6,713,828 B1 | 3/2004 | Chavan et al. |
| 6,743,656 B2 | 6/2004 | Orcutt et al. |
| 7,015,060 B1 | 3/2006 | Kubena et al. |
| 7,052,122 B2 | 5/2006 | Hoisington et al. |
| 7,135,749 B2 | 11/2006 | Sakai et al. |
| 7,273,763 B1 | 9/2007 | Neumeier et al. |
| 7,482,193 B2 | 1/2009 | DCamp et al. |
| 2002/0043710 A1 | 4/2002 | Mayer et al. |
| 2003/0024633 A1* | 2/2003 | Ogura et al. ............ 156/250 |
| 2003/0056598 A1 | 3/2003 | Kimura et al. |
| 2003/0143775 A1 | 7/2003 | Brady |
| 2004/0237285 A1 | 12/2004 | Rangsten et al. |
| 2005/0156320 A1 | 7/2005 | Mastromatteo |
| 2005/0229711 A1 | 10/2005 | Ohms et al. |
| 2006/0032039 A1 | 2/2006 | Rangsten et al. |
| 2006/0097331 A1 | 5/2006 | Hattori et al. |
| 2007/0141808 A1 | 6/2007 | Fortin et al. |
| 2007/0275494 A1 | 11/2007 | Mayer et al. |
| 2007/0275495 A1 | 11/2007 | Mayer et al. |

FOREIGN PATENT DOCUMENTS

| | | |
|---|---|---|
| EP | 1677346 | 10/2002 |
| EP | 1717562 | 4/2005 |
| EP | 1860417 | 11/2007 |
| WO | WO2004106879 | 12/2004 |
| WO | WO2006114005 | 11/2006 |

OTHER PUBLICATIONS

Extended European Search Report of EP 08015174.9, Jun. 29, 2009.

Sensors and Actuators A34 (1992)217-224; "Fabrication of Microdiaphragm Pressure Sensor Utilizing Micromachining", Tetsuo Fujii et al.

Sensors and Actuators A92 (2001) 1-9; "CMOS-based Microsensors and Packaging", Henry Baltes et al.

\* cited by examiner

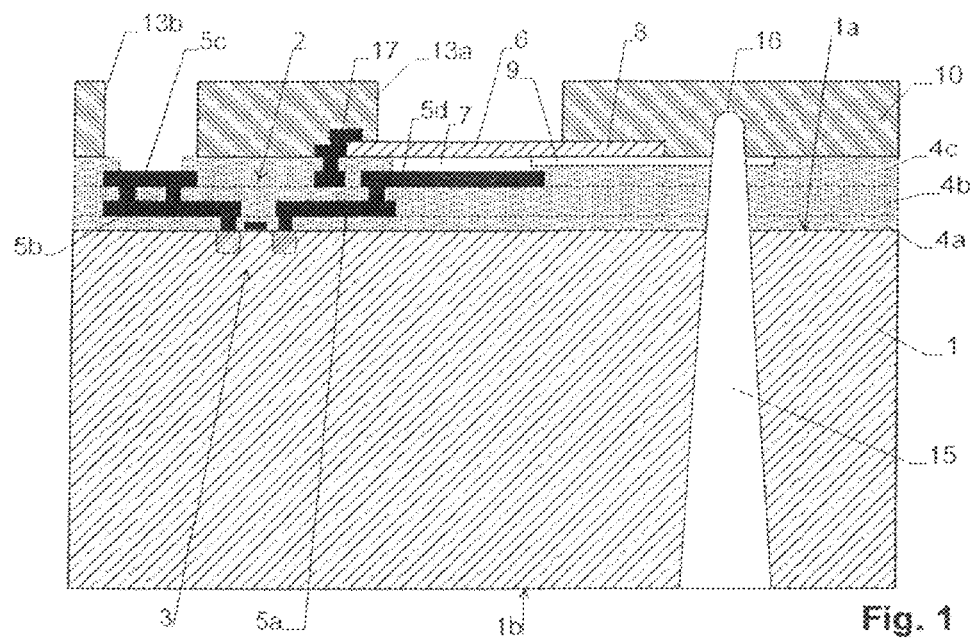
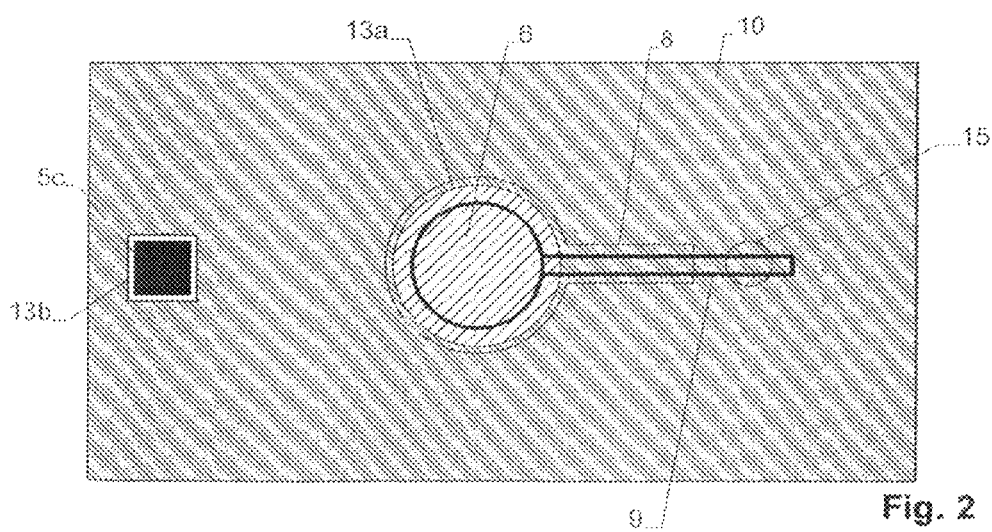
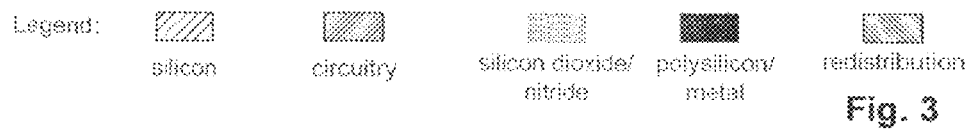

METHOD FOR MANUFACTURING AN INTERGRATED PRESSURE SENSOR

CROSS REFERENCE TO RELATED APPLICATIONS

This application claims the priority of European patent application 08015174.9, filed Aug. 28, 2008, the disclosure of which is incorporated herein by reference in its entirety.

BACKGROUND OF THE INVENTION

The invention relates to a method for manufacturing a pressure sensor having a flexible membrane integrated on a substrate.

This type of pressure sensor is e.g. described in U.S. Pat. No. 6,584,854. It comprises a flexible membrane integrated on a first side of a substrate. An opening is formed through the substrate from a second side thereof by means of anisotropic etching in order to provide access to the bottom side of the membrane.

This type of design is advantageous for a pressure sensor because it allows to apply one pressure source to the bottom side of the substrate and the other to the top, which makes mounting the chip easier.

BRIEF SUMMARY OF THE INVENTION

It is an object of the present invention to provide an economical method for manufacturing such a pressure sensor.

This object is achieved, in a first aspect of the invention, by a method for manufacturing a pressure sensor comprising the steps of providing a semiconductor substrate, wherein said substrate comprises a flexible membrane integrated on a first side of said substrate, and forming a opening extending from a second side of said substrate through said substrate and being connected to one side of said membrane, wherein said second side is opposite to said first side, wherein said opening is formed by drilling a bore through said substrate by means of a laser.

In a second aspect of the invention, a method for manufacturing a pressure sensor is provided, which method comprises the steps of providing a semiconductor substrate, wherein said substrate comprises a cavity and a flexible membrane integrated on a first side of said substrate, wherein said membrane extends over said cavity, and forming a opening extending from a second side of said substrate through said substrate and being connected to one side of said membrane, wherein said second side is opposite to said first side, wherein said opening is formed by drilling a bore through said substrate by means of a laser, wherein said bore is laterally displaced in respect to said cavity, and wherein a channel is formed for connecting said cavity and said bore, forming a lid on said first side by applying a polymer layer on said first side, wherein said bore ends at said lid.

In a third aspect of the invention, a method for manufacturing a pressure sensor is provided, which method comprises the steps of providing a semiconductor substrate, wherein said substrate comprises a cavity and a flexible membrane integrated on a first side of said substrate, wherein said membrane extends over said cavity, and applying one or more dielectric layers to said first side of said substrate and forming at least part of a channel as a recess in said dielectric layers forming a opening extending from a second side of said substrate through said substrate and being connected to one side of said membrane, wherein said second side is opposite to said first side, wherein said opening is formed by drilling a bore through said substrate by means of a laser, wherein said bore is laterally displaced in respect to said cavity, and wherein said channel connects said cavity and said bore, forming a lid on said first side by applying a polymer layer on said first side, wherein said bore ends at said lid and wherein said lid forms at least part of a wall of said channel, said method further comprising the steps of forming a first section of said channel in said recess and covering it by a layer that forms said membrane, and forming a second section of said channel between said dielectric layers and said lid, wherein an additional spacer layer is applied between said dielectric layers and said lid.

This procedure according to the aspects of the present invention allows to create an accurately placed, well-defined opening, which uses little space on the substrate. In addition, laser drilling is a dry process, which avoids the risk of liquid remaining in the drilled opening or the cavity below the membrane. Also, in contrast to an etching process, laser drilling is a locally confined process, and there is no risk of an undesired removal of material elsewhere—in contrast to this, using an etching process for forming an opening through the substrate may lead to undesired etching elsewhere, e.g. at the metal or silicon layers of the membrane or of the electrical leads.

Advantageously, the bore does not open into the cavity below the membrane directly, but rather it is laterally offset and connected thereto by means of a channel. This design allows to manufacture the membrane prior to drilling the bore without the membrane being in danger to be damaged in the drilling process.

The present method is compatible with a standard CMOS manufacturing process. In particular, in an advantageous embodiment, the semiconductor substrate is provided, prior to forming said opening, with CMOS circuitry integrated thereon.

In yet a further advantageous embodiment, a lid is formed on the first side of the substrate over the bore. Such a lid allows to close the opening and it can be optimized for that purpose, e.g. in view of its thickness or material.

BRIEF DESCRIPTION OF THE DRAWINGS

The invention will be better understood and objects other than those set forth above will become apparent when consideration is given to the following detailed description thereof. Such description makes reference to the annexed drawings, wherein:

FIG. 1 is a sectional view through a first embodiment of the sensor,

FIG. 2 is a top view of the sensor of FIG. 1,

FIG. 3 is a list of the most important hatching patterns used in the figures.

DETAILED DESCRIPTION OF THE INVENTION

Figure 4:
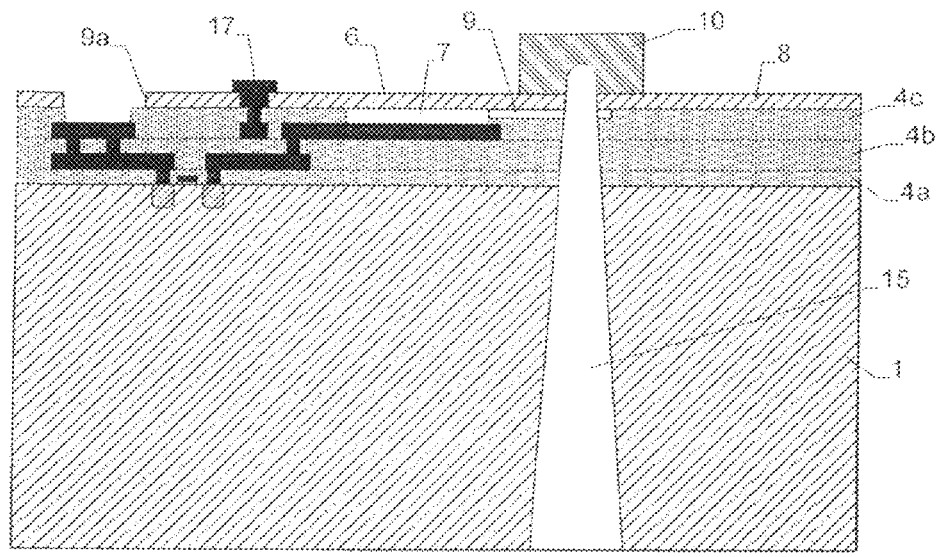
FIG. 4 is a sectional view through a second embodiment of the sensor.

Definitions:

The terms "top", "up", "above" as well as "bottom", "down" and "below" refer to a direction perpendicular to the substrate's surface, with the membrane being on the "top side" of the substrate.

The term "laterally displaced" designates a displacement parallel to the substrate's surface.

A "pressure sensor" is to be understood to encompass any sensor measuring a pressure or a parameter depending on the pressure due to deformation of the membrane. In particular, the term comprises sensors for measuring absolute or differential pressure, static or dynamic pressure (including sound), even though the invention is most advantageously applied for differential pressure sensors.

Detailed Description of Some Embodiments:

First Embodiment:

The first embodiment, as shown in FIGS. 1 and 2, uses a semiconductor chip having a substrate 1, which is preferably a silicon substrate. Circuitry 2 is arranged at a first (top) side 1a of substrate 1. Even though, in the embodiment of FIG. 1, this circuitry 2 is shown as a single transistor 3 and some electric leads only, it can be much more complex than that and can e.g. comprise analog as well as digital processing circuitry integrated on substrate 1. Alternatively, no active circuitry may be provided on substrate 1 at all.

As known to the skilled person, the top side 1a of substrate 1 is covered by several dielectric layers 4a-4c, typically of silicon dioxide and/or silicon nitride with polysilicon or metal leads 5a-5d of circuitry 2 adjacent thereto or embedded therein. Such a design of metal, polysilicon and dielectric layers as well as integrated active components (such as transistor 3 and its doped gate region) is known to the skilled person and can e.g. be manufactured using a standard CMOS manufacturing process.

Furthermore, bond pads 5c e.g. made from one of the metallic layers mentioned above, can be integrated on top of first side 1a of substrate 1 and serve to connect the circuitry 2 to an external system. For simplicity, FIGS. 1 and 2 show a single bond pad 5c only. It must be noted, though, that a complete device will generally comprise several such bond pads.

The pressure sensor further comprises a membrane 6 spanning a cavity 7. Membrane 6 is, in the present embodiment, made of a silicon layer 8 lying on topmost dielectric layer 4c. Cavity 7 is formed by a recess in at least topmost dielectric layer 4c, and it has a bottom formed by a metallic or polysilicon layer 5d.

A channel 9 extends laterally away from cavity 7. Channel 9 is also formed by a recess in at least topmost di-electric layer 4c, with silicon layer 8 forming a top wall of channel 9 in a first section thereof.

Topmost dielectric layer 4c as well as silicon layer 8 are covered partially by a lid or lid layer 10. Lid layer 10 forms a top wall for a second section of channel 9.

In the embodiment of FIGS. 1 and 2, lid layer 10 is a polymer layer, in particular a structured photoresist layer. It closes channel 9 from above, but it does not extend over all of the sensor. In particular, it neither covers membrane 6, nor the bond pads 5c. For this purpose, it may be provided with suitable openings 13a, 13b.

A opening formed by a bore 15 extends from the second (bottom) side 1b of substrate 1 all through substrate 1 and the dielectric layers 4a-4c. Bore 15 ends at or in lid layer 10, as shown by bore end 16 of FIG. 1. It communicates with channel 9, such that a continuous passage is formed between the bottom side of membrane 6 and the second (bottom) side 1b of substrate 1.

The device of FIGS. 1 and 2 is adapted to measure a pressure difference between the top and bottom sides of membrane 6 and therefore between the top and bottom sides of the device if the same is packaged in a suitable housing as described below. The shape of membrane 6 varies according to the pressure difference, and, for the same reason, the electrical capacitance between electrode 5d and membrane 6 varies. This change of capacitance can be measured, either by circuitry 2 or by external electronics. For this purpose, a metal or polysilicon connector 17 is provided for electrically connecting membrane 6 to circuitry 2 and/or the bond pads 4c.

In the following, an advantageous example of a manufacturing process for the device of FIGS. 1 and 2 is described. It must be noted, though, that the same or a slightly modified process can also be used to manufacture the embodiments of the devices of the other figures.

The process is based on manufacturing a plurality of pressure sensors simultaneously on a common semiconductor wafer.

First, circuitry 2, including all polysilicon and metal layers 5a-5d (with the exception of the topmost part of connector 17) as well as the dielectric layers 4a-4c are integrated on the wafer e.g. using a standard CMOS process.

In one of the last steps of the CMOS process, the recesses for forming cavity 7, channel 9 and the window over bond pad 5c are formed in one or more of the dielectric layers 4c.

Now, a silicon-on-insulator wafer ("SOI"-wafer) is provided. This is a second wafer having a silicon substrate, with an insulator layer and a silicon layer thereon. Such SOI-wafers are known to the skilled person. The SOI-wafer is used to prepare membrane 6 basically as described in EP 1 860 417, e.g. in reference to FIG. 9 therein. The disclosure of this part of EP 1 860 417 is enclosed herein by reference.

Simply said, the SOI-wafer is mounted with the silicon layer facing the topmost dielectric layer 4c and is attached thereto. Then, the silicon substrate of the SOI-wafer is etched off, and subsequently the insulator layer of the SOI-wafer is etched off as well. The remaining silicon layer 8 is structured using photolithography in order to form the desired shape as shown in FIG. 2. Now, topmost part of connector 17 is formed in order to electrically connect silicon layer 8 to the leads of circuitry 2.

In a next step, the lid over the device is formed by applying lid layer 10 from the first (top) side of the substrate.

In the present embodiment, prior to applying lid layer 10, the recess that will later form channel 9 is yet open. Hence, in order to avoid that channel 9 is blocked by lid layer material, lid layer 10 is advantageously applied as a solid film.

Lid layer 10 is e.g. a polymer, in particular a photoresist that can easily be structured using microlithography. It can e.g. be an "epoxy dry film". Alternatively, lid layer 10 can e.g. be formed by a layer of silicon, glass, metal, or ceramics.

Lid layer 10 is then is structured to provide the openings 13a, 13b therein.

This procedure allows to apply lid layer 10 to all sensors on the wafer in a single step.

In a next step, bore 15 is drilled from the second (bottom) side 1b of substrate 1. A drilling from this side is advantageous for the following reasons:

Laser drilling leads to a certain degree of mechanical stress within substrate 1. This stress is largest at the side from which the drilling occurs. By drilling from bottom side 1b, the largest stress is confined to the bottom side of substrate 1, while the top side remains substantially stress free, which prevents stress-induced drift or malfunction in the components of integrated circuitry 2.

As shown in FIG. 1, bore 15 is generally of a tapered shape, with a maximum diameter at the side from which drilling occurs. By drilling from below, this maximum diameter is at the bottom side 1b of substrate 1, where there is more room to spare than at the top side 1a.

Material evaporated or sputtered off by the laser light tends to be redeposited on the substrate's bottom side instead of its top side.

The depth of bore 15 can be controlled accurately, in particular if individual laser pulses from a pulsed laser are used for drilling. In that case, the laser pulses can be counted and the drilling ends after a predefined number of laser pulses.

Techniques for laser drilling semiconductor wafers are e.g. described in EP 1 677 346.

The depth of bore 15 is chosen such that it reaches at least into channel 9. Advantageously, in order to provide a good and reliable connection between bore 15 and channel 9, bore 15 reaches slightly into lid layer 10 with its end 16 located therein.

Once that the bores 15 have been drilled for all sensors on the wafer, the wafer can be cut (diced) to form the individual sensors.

Second Embodiment

Figure 5:
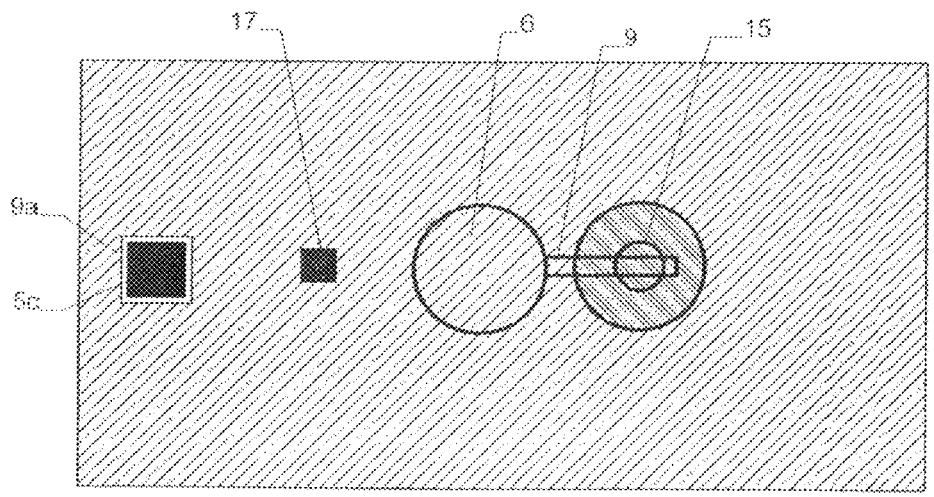
FIG. 5 is a top view of the sensor of FIG. 4.

FIGS. 4 and 5 show a second embodiment of the invention. It differs from the of FIGS. 1 and 2 in that silicon layer 8 extends all over the device and only has an opening at the location of bond pad(s) 5c. Hence, it also covers all of channel 9.

Lid layer 10, on the other hand, has a much smaller extension and is confined to form, together with silicon layer 8, a local lid over the location of bore 15.

The device according to the second embodiment can be manufactured basically in the same manner as the device of FIGS. 1 and 2, with different structuring being applied to silicon layer 8 and lid layer 10.

It must be noted that in this case bore 15 reaches at least the silicon layer 8 and may even extend into or through the silicon layer 8 as shown in FIG. 4.

Instead of applying lid layer 10 to all the sensors on a wafer in a single step, lid layer 10 can be applied as a small lid of e.g. 100 μm diameter to each sensor individually.

Third Embodiment

Figure 6:
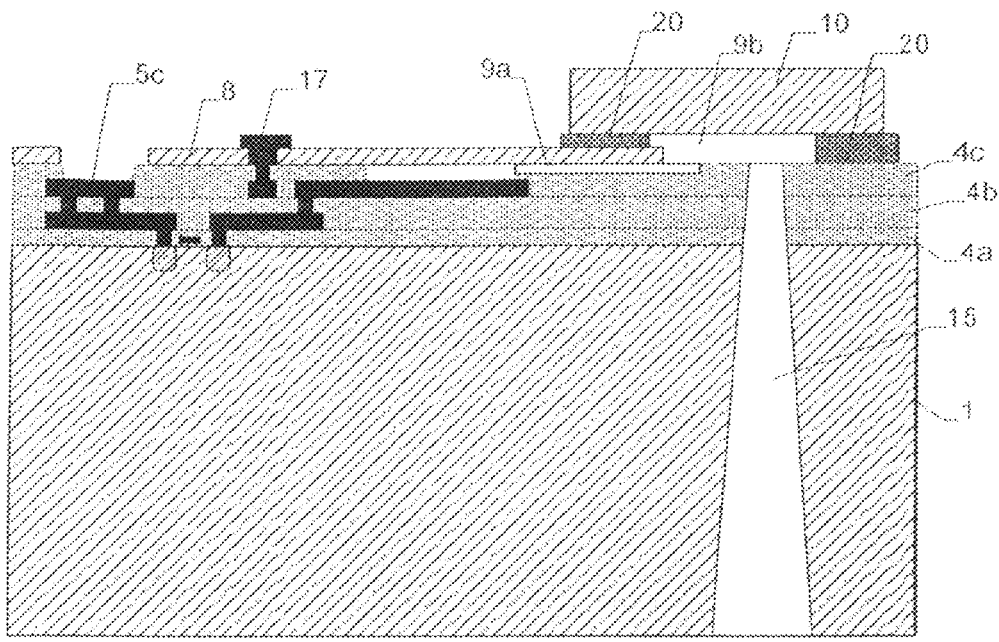
FIG. 6 is a sectional view of a third embodiment of the sensor.

A third embodiment of the invention is shown in FIG. 6. It differs from the one of FIGS. 1 and 2 in that the lid is applied after drilling the bore. Both procedures have their specific advantages:

If the lid is applied prior to drilling the bores 15, handling the wafer by means of standard vacuum chucks remains possible. In contrast to this, the perforation of the wafer by the bores in the absence of a lid makes the substrate gas permeable, which makes it difficult or even impossible to handle it by means of vacuum chucks in conventional manner.

If the lid is applied after drilling the bores 15, there is no danger that the bores reach too far into the lid or even perforate the same. In addition, if necessary, the bores 15 can be better cleaned after their drilling, and the material of the lid does not have to be compatible with the drilling process.

In the embodiment of FIG. 6, as mentioned, bore 15 is drilled prior to applying lid layer 10.

Lid layer 10 can e.g. be silicon, glass, or metal. A structured adhesive layer 20 is provided for fixing lid layer 10 to the substrate.

Lid layer 10 can again be applied in the form of a wafer or plate to all the sensors on a common wafer simultaneously, whereupon it is structured. Alternatively, it may be applied as a small lid of e.g. 100 μm diameter to each sensor individually, either prior to or after dicing the wafer.

A further difference between the embodiment of FIG. 6 and the preceding embodiments lies in the fact that the channel laterally extending away from cavity 7 now comprises two sections:

A first section 9a is formed as a recess in topmost dielectric layer 4c and is covered by the same layer 8 that also forms the membrane 6.

A second section 9b of the channel is formed between the dielectric layers and lid layer 10, wherein adhesive layer 20 forms a spacer layer between the dielectric layers and the lid.

This design has the advantage that channel 9 can have larger height at the location where it intersects bore 15, which makes it less probable that the connection between the two ducts is clogged, e.g. by material ejected into the channel during the drilling process.

Fourth Embodiment

Figure 7:
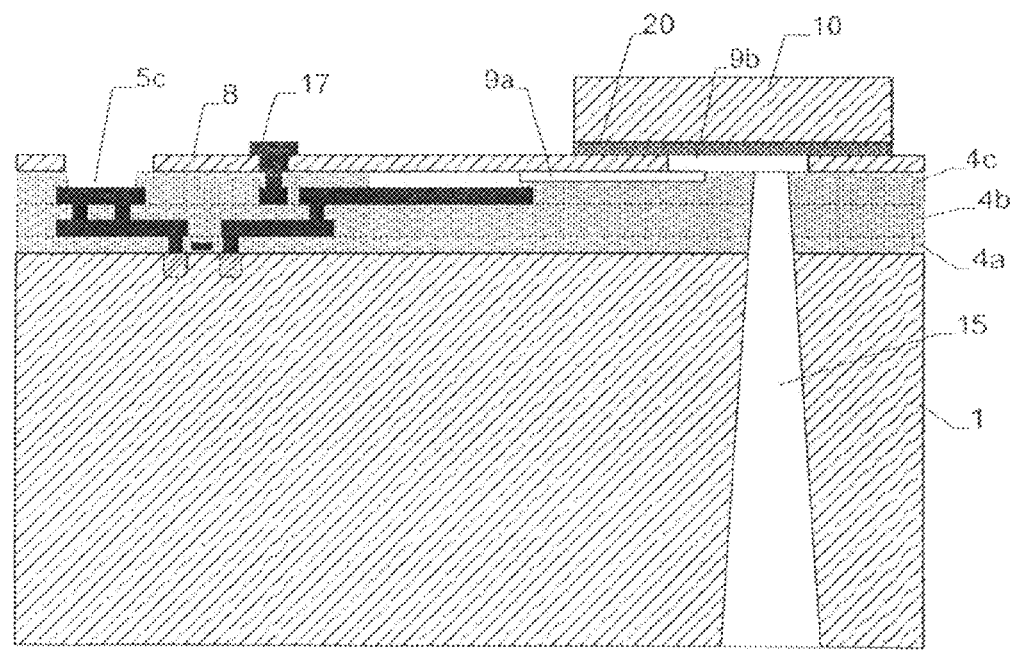
FIG. 7 is a sectional view of a fourth embodiment of the sensor.

The fourth embodiment of FIG. 7 is very similar to the one of FIG. 6, but it differs therefrom by the fact that silicon layer 8 extends all around section 9b of the channel and acts in the role of a spacer layer between the dielectric layers 4a-4c and lid layer 10.

Furthermore, the adhesive layer 20 of the embodiment of FIG. 7 is, in contrast to the embodiment of FIG. 6, not structured and can be applied over all the bottom side of the lid 10.

In this embodiment, the lid 10 is e.g. added individually to each sensor.

Fifth Embodiment

Figure 8:
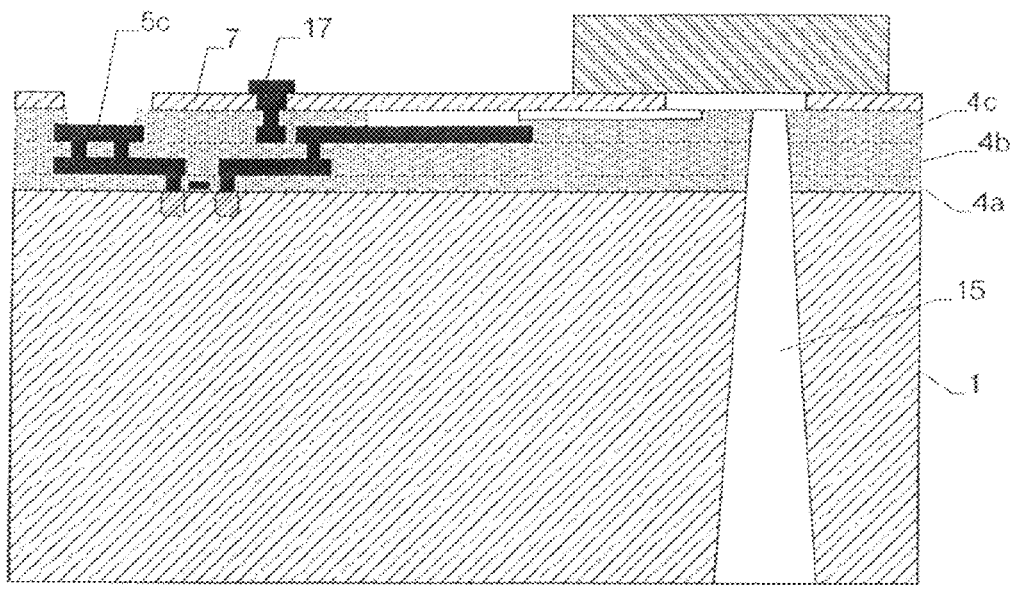
FIG. 8 is a sectional view of a fifth embodiment of the sensor.

The fifth embodiment of FIG. 8 differs from the one of FIG. 7 by the fact that the lid layer 10 is formed by a polymer, in particular an epoxy dry film as mentioned above. The advantage of this design lies in the fact that such a layer can be structured easily without affecting the other components of the device.

Hence, this embodiment can advantageously be manufactured by applying the lid layer 10 as a common film over all the sensors of the wafer simultaneously. However, the pre-shaped lids may also be applied individually to each sensor.

Sixth Embodiment

Figure 9:
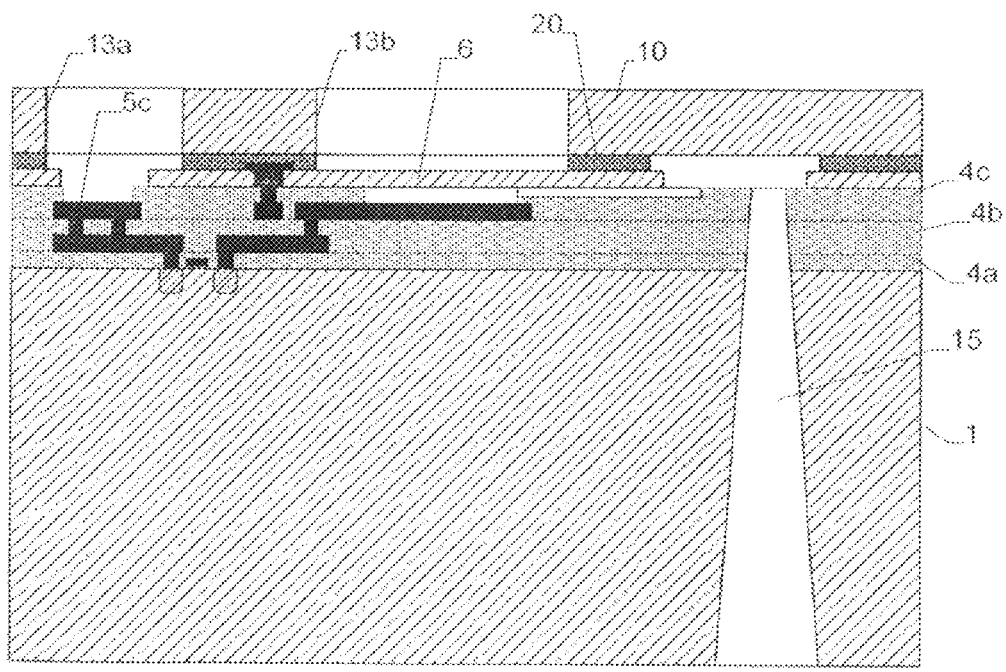
FIG. 9 is a sectional view of a sixth embodiment of the sensor.

The sixth embodiment of FIG. 9 is similar to the one of FIG. 7. It differs therefrom mainly by the fact that the lids of all sensors on a wafer are formed at the same by applying a second wafer (the "lid wafer") to the first side of substrate 1. Before applying the lid wafer, it is structured e.g. by photolithography in order to form the openings 13a, 13b therein for the contact pads as well as the top side of membrane 6, and an adhesive layer 20 is attached to the bottom side of the lid wafer. Then, the lid wafer can be attached to the first side (top side) of the device, i.e. in the present embodiment, to the first side (top side) of silicon layer 8, with the openings 13a, 13b being aligned to the contact pads 5c and the membrane 6, respectively.

In the embodiment of FIG. 9, bore 15 has been formed prior to applying the lid wafer. Similarly to the first and the second embodiment, however, the lid wafer may also be applied to the substrate 7 first, and the bore 15 can be formed in a later step.

Figure 11:
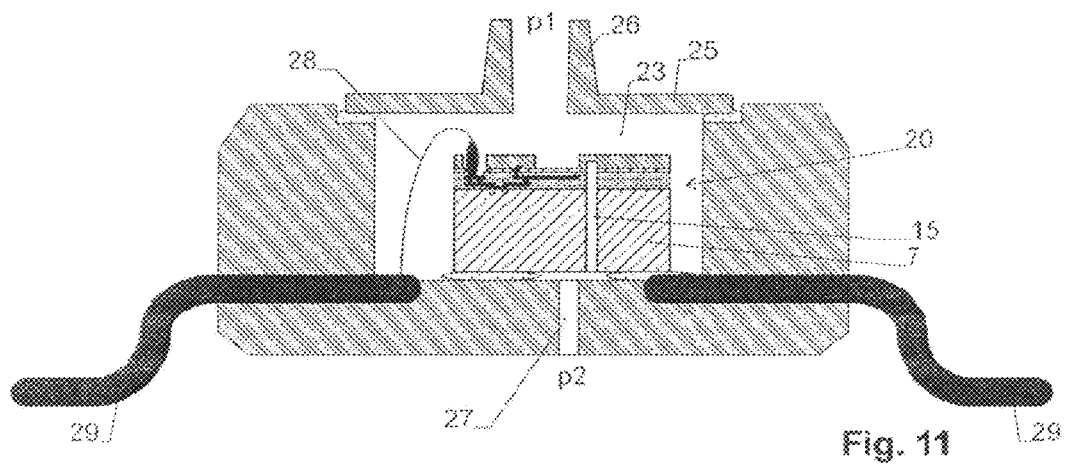
FIG. 11 is a sectional view of the sensor in a SSOP package.
Figure 12:
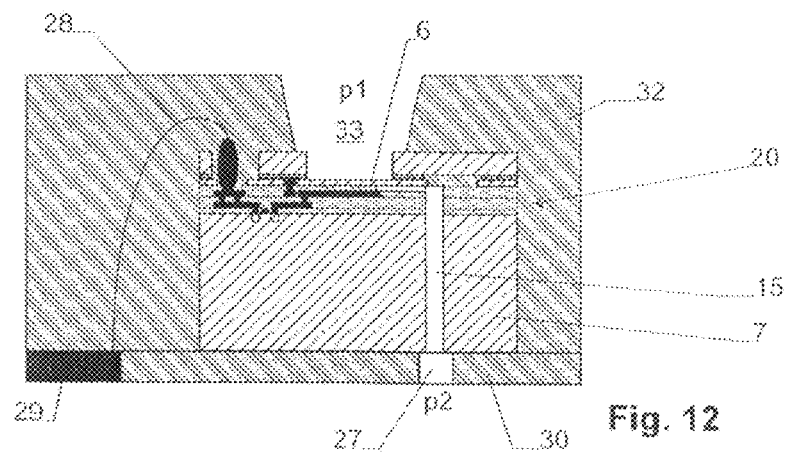
FIG. 12 is a sectional view of the sensor in an overmolded package.

Packaging:

As mentioned above, the sensor can be packaged in a housing. Some packaging examples are shown in FIGS. 10 to 12.

Figure 10:
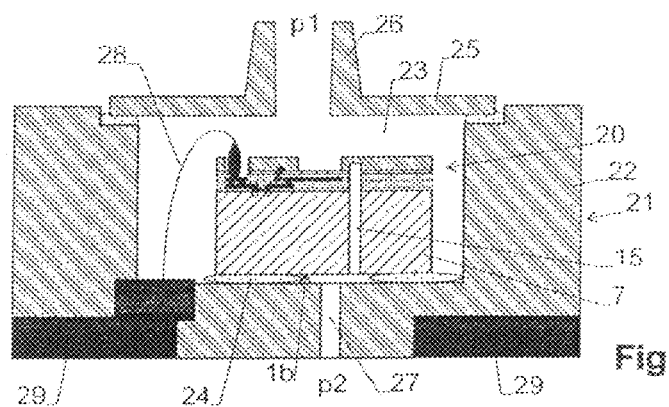
FIG. 10 is a sectional view of the sensor in a QFN package.

In the embodiment of FIG. 10, the sensor, generally denoted by reference number 20, is housed in a QFN package 21. Package 21 comprises a plastic housing body 22 having a central recess 23 for receiving sensor 20. Sensor 20 is glued to the bottom of recess 23 by means of a gas-tight ring 24 extending around the opening of bore 15 in bottom side (second side) 1b of substrate 7. Ring 24 is advantageously an adhesive. It holds sensor 20 in place and provides a gas tight seal around bore 15.

Bond wires 28 are used for connecting the bond pads 5c to the leads 29 of the housing.

Recess 23 is covered by a lid member 25 having a an adapter for connecting the upper side of membrane 6 to a fluid under a first pressure p1.

At the bottom side of recess 23, a duct 27, which communicates with bore 15, provides access to a fluid under a second pressure p2. Therefore, the pressure over membrane corresponds to the pressure difference Δp=p1−p2.

A second embodiment of a sensor, this time in a SSOP package, is shown in FIG. 11. The design of this sensor is basically the same as for the one of FIG. 10, with the primary difference being a different type of package 29 with differently shaped leads 29.

FIG. 12, finally, shows yet a further embodiment of the sensor, this time in a so-called "overmolded" housing. In this embodiment, sensor 20 is first glued to a frame plate 30 with leads 29. An opening 27 through plate 30 is aligned with bore 15 to provide access to the second pressure p2. Bond wires 28 are used to connect the contact pads 5c with the leads 29. Then, the upper part 32 of the package is formed by injection molding, with the mold being shaped to create an access opening 33 to the top side of membrane 6, e.g. as described in WO 2006/114005.

While there are shown and described presently preferred embodiments of the invention, it is to be distinctly understood that the invention is not limited thereto but may be otherwise variously embodied and practised within the scope of the following claims.

The invention claimed is:

1. A method for manufacturing a pressure sensor comprising the steps of
providing a pressure sensor, the pressure sensor comprising a semiconductor chip having a substrate, wherein the substrate has a first side and a second side opposite the first side,
the step of providing a pressure sensor further comprising the steps of
providing, on the first side of the substrate, a flexible membrane layer spanning a cavity, and
forming, by means of a laser, an opening extending from the second side of said substrate through said substrate, wherein the opening is connected to a side of said membrane.

2. The method of claim 1 wherein said bore is laterally displaced with respect to said cavity, and further comprising the step of forming a laterally extending channel, said channel connecting said cavity to said bore.

3. The method of claim 2 further comprising the step. of forming a lid on said first side, wherein said bore ends at said lid.

4. The method of claim 2 wherein said lid is affixed to a dielectric layer disposed on the first side of said substrate.

5. The method of claim 2 wherein the lid comprises a polymer layer.

6. The method of claim 2 wherein said lid is formed by a photoresist layer.

7. The method of claim 5, further comprising the step of applying said polymer layer as an epoxy dry film on said first side.

8. The method claim 3 wherein said membrane layer comprises a silicon layer, wherein said bore extends at least to said silicon layer.

9. The method of claim 8 wherein said silicon layer forms at least part of a wall of said channel.

10. The method of claim 2 wherein said lid is formed prior to drilling said bore, and wherein said bore extends through part of said lid.

11. The method of claim 2 wherein said lid is formed after drilling said bore.

12. The method of claim 2 further comprising
providing a plurality of said pressure sensors simultaneously on the substrate,
forming a lid simultaneously on all said sensors, and
cutting said substrate, after forming said lid, into individual sensors.

13. The method of claim 12, wherein the step of forming the lid further comprises the steps of
providing a lid wafer having a plurality of openings and
applying said lid wafer to the first side of said substrate with said openings being aligned with said membranes.

14. The method of claim 2 further comprising the steps of applying one or more dielectric layers to said first side of said substrate and forming at least part of said channel as a recess in said dielectric layers.

15. The method claim 14 wherein said lid forms at least part of a wall of said channel.

16. The method claim 15 comprising the steps of
forming a first section of said channel in said recess such that it is covered by said membrane, and
forming a second section of said channel between said dielectric layers and said lid, and
applying an additional spacer layer between said dielectric layers and said lid.

17. The method Of claim 1 wherein the step of forming the opening by means of a laser comprises drilling said bore from said second side through said substrate.

18. The. method of claim 1 comprising the steps of drilling said bore by means of laser pulses, counting said laser pulses, and ending the drilling of said bore after a predefined number of laser pulses.

19. A method for manufacturing a pressure sensor comprising the steps of
providing a pressure sensor including a substrate, the substrate comprising a semiconductor, and wherein said substrate comprises a cavity and a flexible membrane formed on a first side of said substrate, wherein said membrane extends over said cavity, step of providing a pressure sensor further comprising the steps of
forming an opening extending from a second side of said substrate through said substrate, wherein said opening is connected to a side of said membrane,
wherein said second side is opposite to said first side,
wherein said opening is formed by drilling a bore through said substrate by means of a laser, wherein said bore is laterally displaced with respect to said cavity, and wherein a channel is formed, said channel connecting said cavity and said bore, and forming a lid on said first side by applying a polymer layer on said first side, wherein said bore ends at said lid.

20. The method of claim 19 wherein said polymer layer is a photoresist layer.

21. A method for manufacturing a pressure sensor comprising the steps of providing a pressure sensor comprising a substrate, the substrate comprising semiconducting material, wherein said substrate comprises a cavity and a flexible membrane layer integrated on a first side of said substrate, wherein said membrane layer extends over said cavity, the step of providing a pressure sensor further comprising the steps of applying one or more dielectric layers to said first side of said substrate and forming at least part of a channel as a recess in said dielectric layers, forming an opening extending from a second side of said substrate through said substrate, said opening connecting to one side of said membrane, wherein said second side is opposite to said first side, wherein said opening is formed by drilling a bore through said substrate by means of a laser, wherein said bore is laterally displaced with respect to said cavity, and wherein said channel connects. said cavity .and said bore, forming a lid on said first side by applying a polymer layer on said first side, wherein said bore ends at said lid and wherein said lid forms at least part of a wall of said channel, and further comprising the steps of forming a first section of said channel in said recess and covering it by said membrane layer, and forming a second section of said channel between said one or more dielectric layers and said lid, wherein an additional spacer layer is applied between said one or more dielectric layers and said lid.

\* \* \* \* \*